(12) United States Patent
Moschiano et al.

(10) Patent No.: US 11,688,466 B2
(45) Date of Patent: *Jun. 27, 2023

(54) BITLINE DRIVER ISOLATION FROM PAGE BUFFER CIRCUITRY IN MEMORY DEVICE

(71) Applicant: Micron Technology, Inc., Boise, ID (US)

(72) Inventors: Violante Moschiano, Avezzano AQ (IT); Dheeraj Srinivasan, San Jose, CA (US); Andrea D'Alessandro, Avezzano AQ (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/678,960

(22) Filed: Feb. 23, 2022

(65) Prior Publication Data
US 2022/0180936 A1 Jun. 9, 2022

Related U.S. Application Data

(63) Continuation of application No. 16/947,091, filed on Jul. 17, 2020, now Pat. No. 11,276,470.

(51) Int. Cl.
G11C 16/24 (2006.01)
G11C 16/04 (2006.01)
G11C 16/26 (2006.01)

(52) U.S. Cl.
CPC .......... *G11C 16/24* (2013.01); *G11C 16/0483* (2013.01); *G11C 16/26* (2013.01)

(58) Field of Classification Search
CPC ...... G11C 16/24; G11C 16/0483; G11C 16/26
(Continued)

(56) References Cited

U.S. PATENT DOCUMENTS 8,675,421 B2 3/2014 Cho
2007/0088886 A1* 4/2007 Conner ............... G06F 13/1663
710/244

(Continued)

OTHER PUBLICATIONS

International Serach Report and Written Opinion for International Application No. PCT/US2021/042076, dated Oct. 2021, 13 pages.

*Primary Examiner* — Michael T Tran
(74) *Attorney, Agent, or Firm* — Lowenstein Sandler LLP

(57) ABSTRACT

A page buffer circuit in a memory device includes a logic element configured to perform a series of calculations pertaining to one or more memory access operations and generate a plurality of calculation results associated with the series of calculations and a dynamic memory element coupled with the logic element and configured to store the plurality of calculation results. The page buffer circuit further includes an isolation element coupled between the logic element and the dynamic memory element, the isolation element to permit a calculation result from the logic element to pass to the dynamic memory element when activated and a circuit coupled to the dynamic memory element and configured to perform pre-charging operations associated with the one or more memory access operations and based at least in part on the plurality of calculation results stored in the dynamic memory element. The circuit coupled to the dynamic memory element can perform a first operation on the memory array based at least in part on a first calculation result stored in the dynamic memory element during a first period of time when the isolation element is deactivated to disconnect the logic element from the dynamic memory element, and the logic element is configured to concurrently generate a second calculation result during the first period of time.

20 Claims, 5 Drawing Sheets

(58) Field of Classification Search
USPC .............................................. 365/189.05, 205
See application file for complete search history.

(56) References Cited

U.S. PATENT DOCUMENTS

| | | | |
|---|---|---|---|
| 2008/0309910 A1* | 12/2008 | Takahashi | F16F 15/027 355/72 |
| 2010/0232205 A1* | 9/2010 | Parkinson | G11C 11/5678 714/763 |
| 2011/0305081 A1 | 12/2011 | Lee | |
| 2012/0281488 A1 | 11/2012 | Jung et al. | |
| 2013/0320480 A1* | 12/2013 | Mcshane | H01L 23/3107 257/E29.166 |
| 2014/0334233 A1 | 11/2014 | Joo et al. | |
| 2015/0029796 A1 | 1/2015 | Choi et al. | |
| 2015/0146488 A1 | 5/2015 | Lim et al. | |
| 2015/0378917 A1* | 12/2015 | Busaba | G06F 9/30076 711/137 |
| 2016/0062736 A1* | 3/2016 | Stanfill | G06F 3/0482 717/105 |
| 2016/0172056 A1 | 6/2016 | Huh | |
| 2016/0180967 A1 | 6/2016 | Park | |
| 2016/0292486 A1* | 10/2016 | Prusik | G06K 19/06046 |
| 2017/0243656 A1 | 8/2017 | Murakami et al. | |
| 2018/0101424 A1 | 4/2018 | Lim et al. | |
| 2019/0034121 A1 | 1/2019 | Kuwamura | |
| 2019/0109994 A1 | 4/2019 | Kikuchi et al. | |
| 2019/0191387 A1 | 6/2019 | Shakya et al. | |
| 2019/0197083 A1 | 6/2019 | Chen et al. | |
| 2019/0237144 A1 | 8/2019 | Kim | |
| 2019/0304563 A1 | 10/2019 | Her et al. | |
| 2019/0325938 A1 | 10/2019 | Lee | |
| 2019/0332311 A1 | 10/2019 | Shin | |
| 2019/0333592 A1 | 10/2019 | Lee et al. | |
| 2020/0202952 A1 | 6/2020 | Lee et al. | |
| 2020/0342919 A1 | 10/2020 | Park et al. | |
| 2020/0350017 A1 | 11/2020 | Lee | |
| 2021/0005275 A1 | 1/2021 | Hwang et al. | |
| 2021/0065810 A1 | 3/2021 | Paolucci et al. | |
| 2021/0320119 A1 | 10/2021 | Zhang et al. | |

* cited by examiner

US 11,688,466 B2

BITLINE DRIVER ISOLATION FROM PAGE BUFFER CIRCUITRY IN MEMORY DEVICE

RELATED APPLICATIONS

This application is a continuation of U.S. patent application Ser. No. 16/947,091, filed Jul. 17, 2020, the entire contents of which are hereby incorporated by reference herein.

TECHNICAL FIELD

Embodiments of the disclosure relate generally to memory sub-systems, and more specifically, relate to bitline driver isolation from page buffer circuitry in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
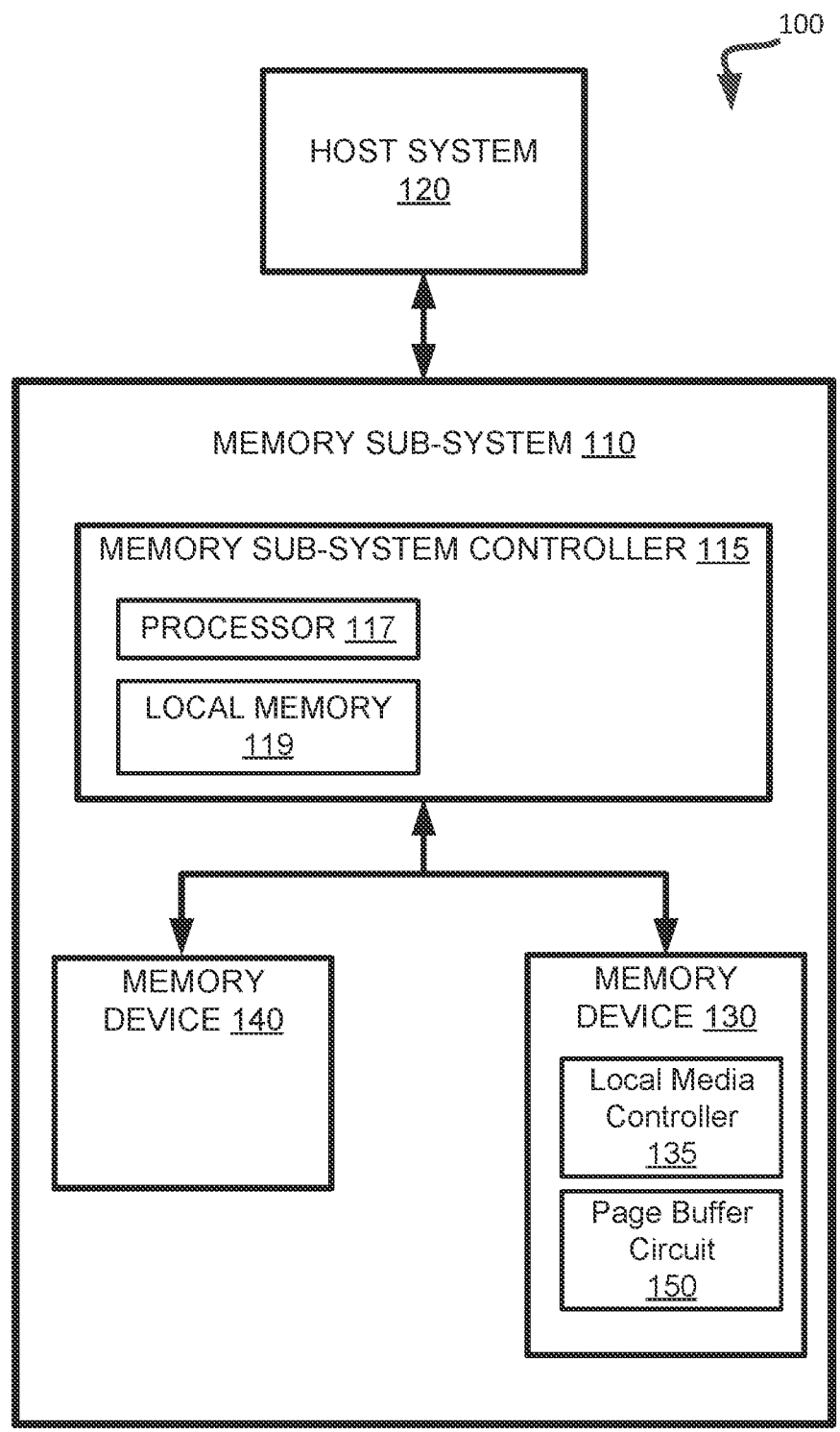
FIG. 1 illustrates an example computing system that includes a memory sub-system in accordance with some embodiments of the present disclosure.

Aspects of the present disclosure are directed to bitline driver isolation from page buffer circuitry in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

Certain memory access operations performed on a block of a memory device involve the application of certain voltages to the wordlines, as well as the pre-charging of the bitlines. In order to confirm whether a memory cell in the block is in an erase state "1" or program state "0," a verification of a change in potential can be difficult to recognize unless the bitline is provided with a certain level of potential. Thus, certain devices apply a pre-charge voltage to increase the voltage of the bitline to a predetermined value in advance, followed by detecting a change in the voltage of the bitline when the bitline is applied to a memory cell by comparing the voltage of the bitline with the pre-charged voltage used as a reference. This pre-charging is performed frequently during memory access operations and, therefore, the time required for pre-charging has a large influence on data access time.

During certain memory access operations, one or more calculations are performed on the memory device prior to the pre-charging being initiated. For example, if not all of the bitlines associated with a block are to be pre-charged, firmware in the memory device can identify the corresponding bitlines that are to be pre-charged before selectively initiating the pre-charging on those identified bitlines. In another example, where selective slow program convergence (SSPC) is used to improve a program threshold voltage (Vt) distribution width, multiple pre-verify voltage levels are calculated prior to initiating the pre-charging. Still other calculations are contemplated and examples of such are collectively referred to herein as "elaborations." In general these elaborations take time to complete, and thus introduce a latency (e.g., overhead) into the associated memory access operations. As a result, the initiation of the pre-charging of the bitlines, as well as the application of voltages to the wordlines, is often delayed. This delay leads to increases in the time associated with performing the memory access operations, which can negatively impact performance of the memory device and a quality of service in the memory sub-system.

Aspects of the present disclosure address the above and other deficiencies by introducing bitline driver isolation from page buffer circuitry in a memory device of a memory sub-system. In one embodiment, an isolation element and a dynamic memory element are included between a logic element (e.g., sense amplifier (SA) latch) in a page buffer circuit and one or more bitline drivers used to perform pre-charging operations on the bitlines of the memory device. In one embodiment, the logic element performs any calculations (e.g., elaborations) associated with a present memory access operation and passes a calculation result to the dynamic memory element which is designed to store the result for a given period of time. In one embodiment, the dynamic memory element can include one or more semiconductor devices, as well as associated signal routing lines, which can be sized to present adequate capacitance to store the result for the given period of time. Once the result is stored in the dynamic memory element, the isolation element can disconnect the logic element from the dynamic memory element. During the subsequent given period of time, the one or more bitline drivers can access the dynamic memory element and perform a pre-charging operation on the bitlines of the memory device, at least partially according to the calculation result stored in the dynamic memory element. Since the logic element is isolated from the dynamic memory element during the given period of time, the logic element can initiate performance of subsequent calculations while the pre-charging is occurring using the result of previous calculations. Once the concurrent pre-charging and subsequent calculations are complete, the isolation element can reconnect the logic element to the dynamic memory element, causing the result of the subsequent calculations to be stored in the dynamic memory element and a subsequent pre-charging operation can be performed without the delay normally associated with performing the subsequent calculations.

Advantages of this approach include, but are not limited to, the ability to perform pre-charging of bitlines using previous calculations while concurrently performing subsequent calculations to be used in a subsequent pre-charging operation. This can be achieved with the addition of a single transistor (i.e., the isolation element) to the page buffer circuitry of the memory device, rather than requiring an entire additional static latch to store the calculation result. Accordingly, the latency is decreased without the addition of significant area to the page buffer circuitry. This latency decrease allows read operations, program operations, and any other operations that utilize pre-charging to be performed in less time, which improves performance of the memory device and quality of service in the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, memory device 130 includes page buffer circuit 150. Page buffer circuit 150 can include data storage elements and associated circuitry which can temporarily store data during operations relating to reading data from or writing data to a memory array of memory device 130. For example, during a write operation, page buffer circuit 150 can hold segments of data which additional data is accumulated to match a data unit size utilized by memory device 130. Similarly, during a read operation, page buffer circuit 150 can hold segments of data read from memory device 130 while portions of that data are provided to memory sub-system controller 115 or some other component in memory sub-system 110. As described herein, in one embodiment, page buffer circuit 150 implements bitline driver isolation from page buffer circuitry in memory device 130. In one embodiment, page buffer circuit 150 includes a logic element (e.g., sense amplifier (SA) latch) configured to perform a series of calculations pertaining to one or more memory access operations and generate a plurality of calculation results associated with the series of calculations. Page buffer circuit 150 can further include a dynamic memory element configured to store the plurality of calculation results, and one or more bitline driver circuits configured to perform pre-charging operations on a memory array of memory device 130, where the pre-charging operations are associated with the one or more memory access operations and are based at least in part on the plurality of calculation results stored in the dynamic memory element. In one embodiment, an isolation element is included between the logic element and the dynamic memory element and is configured to permit a calculation result from the logic element to pass to the dynamic memory element when activated. As a result, the one or more bitline driver circuits can perform a first pre-charging operation on the memory array based at least in part on a first calculation result stored in the dynamic memory element during a first period of time when the isolation element is deactivated to disconnect the logic element from the dynamic memory element. During the same first period of time, the logic element can concurrently generate a second calculation result that can be used in a subsequent pre-charging operation. This subsequent pre-charging operation can then be initiated at the end of the first period of time (i.e. the end of the first pre-charging operation) without the delay normally associated with generating the second calculation result. Further details with regards to the operations of page buffer circuit 150 are described below.

Figure 2A:
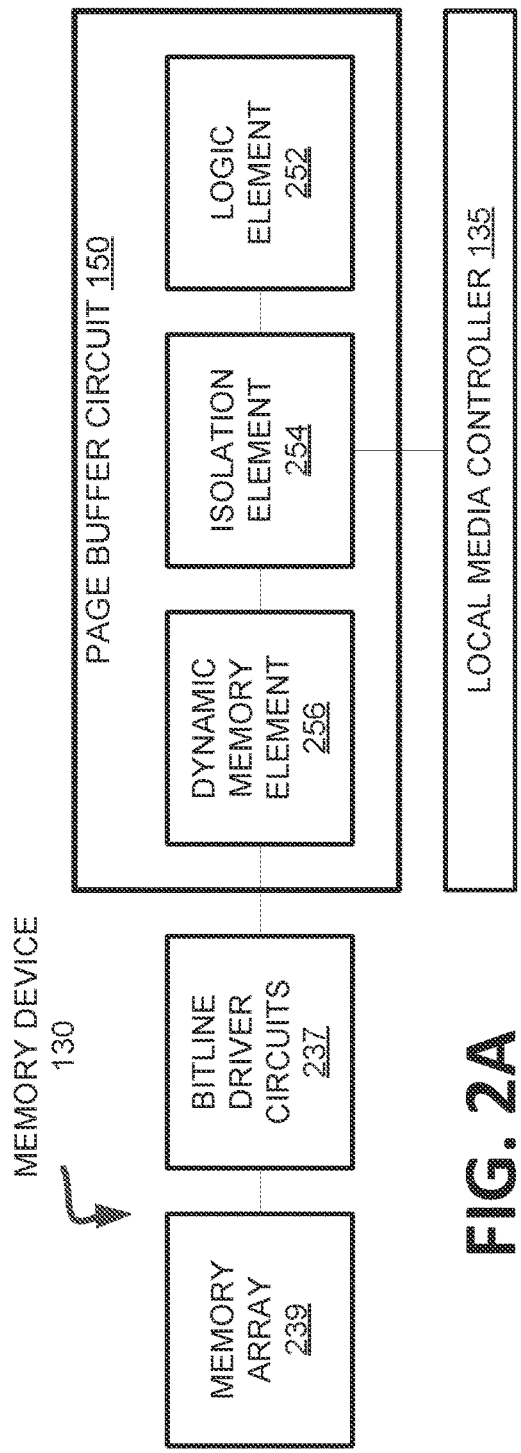
FIG. 2A is a block diagram illustrating a memory device implementing bitline driver isolation from page buffer circuitry in accordance with some embodiments of the present disclosure.

FIG. 2A is a block diagram illustrating a memory device 130 implementing bitline driver isolation from page buffer circuitry in accordance with some embodiments of the present disclosure. Memory device 130 includes local media controller 135 (i.e., control logic) and page buffer circuit 150, as described above with respect to FIG. 1. As illustrated in FIG. 2A, page buffer circuit 150 includes logic element 252, isolation element 254, and dynamic memory element 256. Memory device 130 can further include bitline driver circuits 237 which perform pre-charging operations associated with certain memory access operations on the bitlines of memory array 239. In one embodiment, logic element 252 can perform a series of calculations pertaining to one or more memory access operations and generate calculation results associated with the series of calculations. The type of calculations and associated calculation results can vary depending on the particular implementation, however, one example is related to target-only-verify (TOV). With target-only verify, logic element 252 generates a calculation result including an indication of a subset of the bitlines of memory array 239 (e.g., those bitlines associated with memory cells of a certain level (L1, L2, etc.) being read) associated with a given memory access operation. Another example is related to selective slow program convergence (SSPC), where to improve a program threshold voltage (Vt) distribution width, logic element 252 can generate a calculation result indicating multiple pre-verify voltage levels prior to initiating the pre-charging. Dynamic memory element 256 can store the calculation results generated by logic element 252 and bitline driver circuits 237 can access the calculation results stored in dynamic memory element 256 and perform the pre-charging operations on memory array 239 using the calculation results. For example, if the calculation result in dynamic memory element 256 indicates a subset of the bitlines of memory array 239, bitline driver circuits 237 can apply a pre-charge signal to only that subset of bitlines during the corresponding pre-charging operation.

In one embodiment, isolation element 254 is coupled in a signal path between logic element 252 and dynamic memory element 256 and can provide the bitline driver isolation described herein. In one embodiment, isolation element 254 receives a control signal from local media controller 135, or another source, that activates or deactivates the isolation element. When activated, isolation element 254 can permit the calculation result from logic element 252 to pass to dynamic memory element 256. Once the calculation result is stored in dynamic memory element 256, isolation element can be deactivated to disconnect logic element 252 from dynamic memory element 256. During the subsequent period of time when logic element 252 is disconnected, bitline driver circuits 237 can access dynamic memory element 256 and perform a pre-charging operation on the bitlines of memory array 239, at least partially according to the calculation result stored in dynamic memory element 256. Since logic element 252 is isolated from dynamic memory element 256 during this period of time, logic element 252 can perform subsequent calculations while the pre-charging is occurring using the result of previous calculations. Once the concurrent pre-charging and subsequent calculations are complete, isolation element 254 can be reactivated to reconnect logic element 252 to dynamic memory element 256, causing the result of the subsequent calculations to be stored in dynamic memory element 256. Thus, bitline driver circuits 237 can perform a subsequent pre-charging operation without having to wait for logic element 252 to perform the subsequent calculations.

Figure 2B:
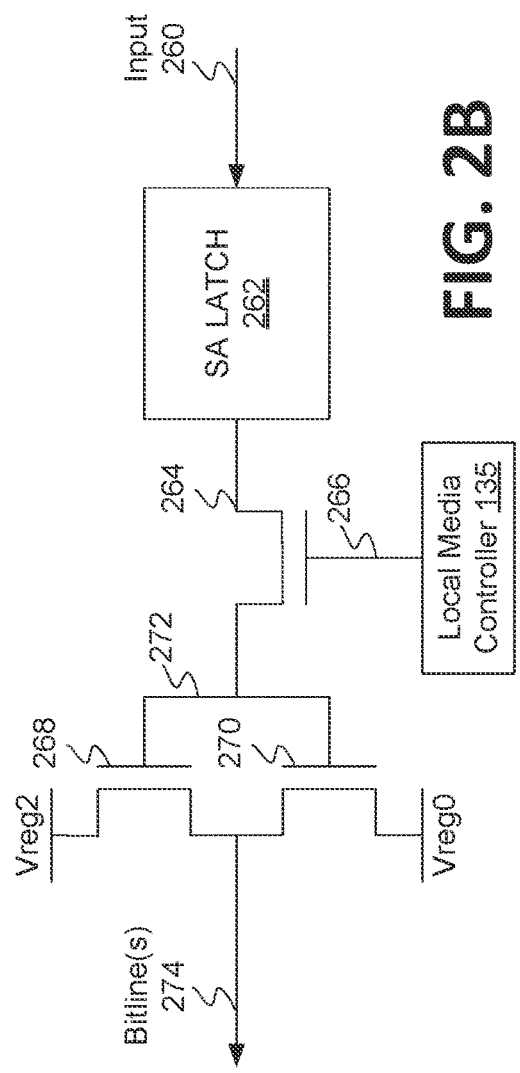
FIG. 2B is a circuit diagram illustrating a memory device implementing bitline driver isolation from page buffer circuitry in accordance with some embodiments of the present disclosure.

FIG. 2B is a circuit diagram illustrating a memory device implementing bitline driver isolation from page buffer circuitry in accordance with some embodiments of the present disclosure. As illustrated in FIG. 2B, SA latch 262 is one implementation of logic element 252. In one embodiment, SA latch 262 receives input data 260 from a source, which can be internal to one of page buffer circuit 150, memory device 130, or memory sub-system 110. In one embodiment, input data 260 can be received from a number of other latches in page buffer circuit 150 and can include a multi-bit value representing, for example, whether each of the plurality of bitlines of memory array 239 are to be subject to a given pre-charging operation. SA latch 262 can be used to perform a calculation on the input data 260 (e.g., a logical combination of the multibit value) to generate a calculation result (e.g., a single bit value based on the multibit value). The calculation result can be represented by a cetain voltage level output by SA latch 262. As described herein, SA latch 262 can be used to perform a series of such calculations to generate a plurality of calculation results. In one embodiment, each calculation is based on different input data 260 corresponding to a different memory access operation or a different portion of the same memory access operation. In one embodiment, each calculation corresponds to a different pre-charging operation to be performed by bitline driver circuits 237 on memory array 239.

In one embodiment, semiconductor device 264 is coupled to the output of SA latch 262. Semiconductor device 264 is one implementation of isolation element 254 and can include, for example, a metal oxide semiconductor field effect transistor (MOSFET) device or other type of device. In one embodiment, semiconductor device 264 is controlled by control signal 266 received from local media controller 135, or another source, at a gate terminal. The control signal 266 can activate (i.e., turn ON to allow signal flow) or deactivate (i.e., turn OFF to prevent signal flow) the semiconductor device 264. When activated, semiconductor device 264 can permit the calculation result from SA latch 262 to pass to the dynamic memory element. In one embodiment, the dynamic memory element can include one or more semiconductor devices, such as semiconductor devices 268 and 270, as well as associated signal routing lines 272, which can be sized to present adequate capacitance to store the calculation result for a given period of time. Semiconductor devices 268 and 270 can include, for example, MOSFET devices or other types of devices. When semiconductor device 264 is deactivated, the capacitance associated with semiconductor devices 268 and 270 and signal routing lines 272 can maintain a charge from the signal representing the calculation result received from SA latch 262 through semiconductor device 264 for a certain period of time. During that period of time, one or both of semiconductor devices 268 and 270 are activated allowing a voltage from one or both of voltage supplies Vreg2 and Vreg0 to flow onto one or more bitlines 274 of the memory array 239 as a pre-charge signal during a pre-charging operation. Voltage supplies Vreg2 and Vreg0 can represent at least a portion of bitline driver circuits 237. In this manner, the pre-charging operation is based at least in part on the calculation result stored by the capacitance of semiconductor devices 268 and 270 and signal routing lines 272.

While semiconductor device 264 is deactivated (i.e., when control signal 266 is de-asserted), SA latch 262 is free to receive subsequent input data 260 and can be used to perform a subsequent calculation to generate a subsequent calculation result. In one embodiment SA latch 262 can be used to perform the subsequent calculation concurrently (i.e., at least partially overlapping in time) with the pre-charging operation being performed based on the previous calculation result. Once the concurrent pre-charging operation and subsequent calculation are complete, semiconductor device 264 is reactivated to permit the subsequent calculation result to be stored in dynamic memory element and a subsequent pre-charging operation can be performed. Thus, the latency associated with performing the subsequent calculations is reduced or eliminated.

Figure 3:
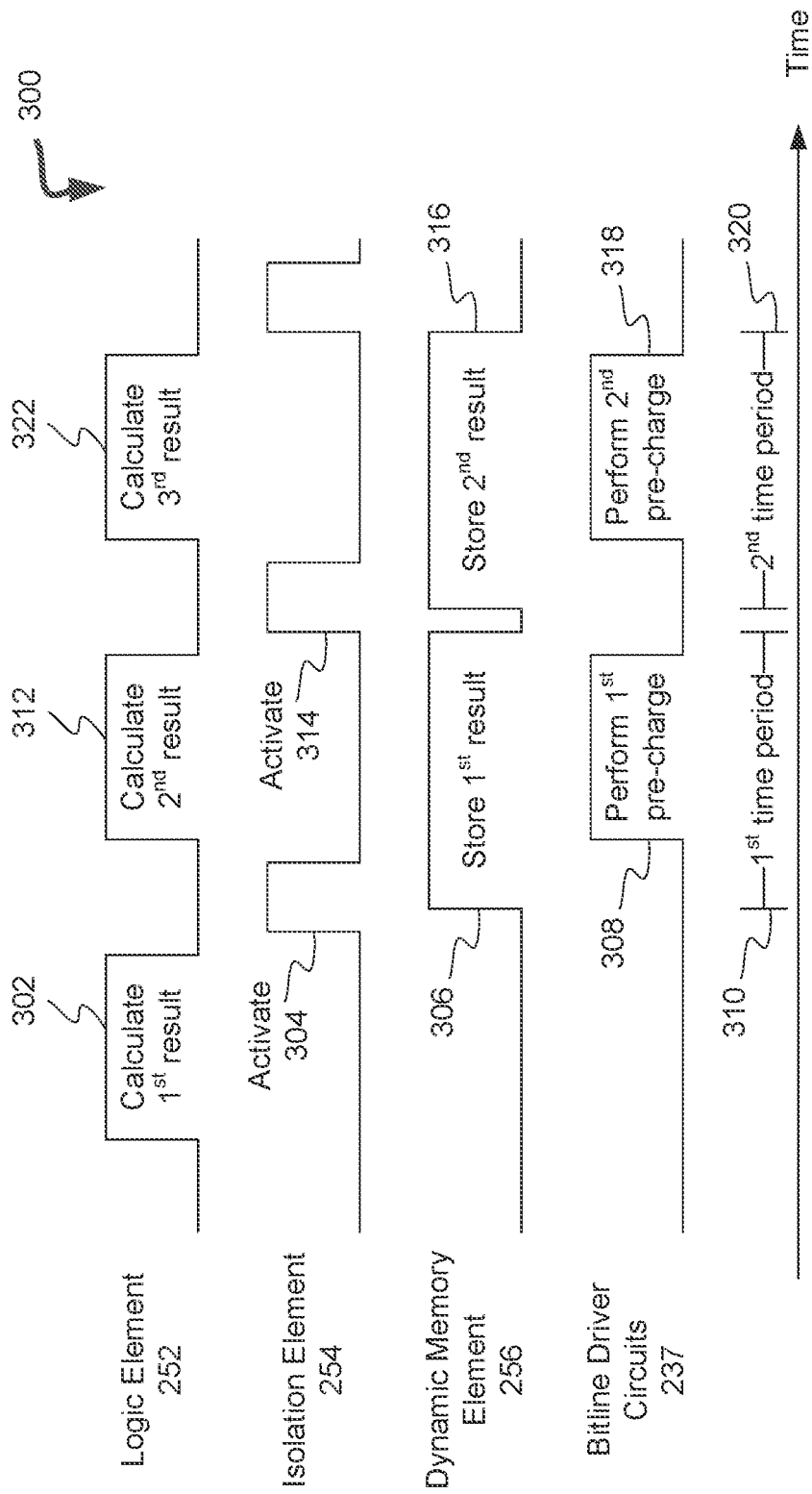
FIG. 3 is a timing diagram illustrating operation of a memory device implementing bitline driver isolation from page buffer circuitry in accordance with some embodiments of the present disclosure.

FIG. 3 is a timing diagram illustrating operation of a memory device implementing bitline driver isolation from page buffer circuitry in accordance with some embodiments of the present disclosure. Timing diagram 300 illustrates the state of logic element 252, isolation element 254, dynamic memory element 256, and bitline driver circuits 237 during performance of one or more memory access operations, as time progresses. During period 302, logic element 252 can determine a first calculation result. When the first calculation is complete, during period 304, local media controller 135 can assert control signal 266 to activate isolation element 254. When isolation element 254 is activated, the first calculation result is permitted to pass through isolation element 24 and is stored in dynamic memory element 256 at period 306. While the first calculation result is stored in dynamic memory element 256, bit line driver circuits 237 can perform a first pre-charge operation during period 308. The period of time for which the first calculation result is stored at dynamic memory element 256 can be referred to as a first period of time 310.

During the first period of time 310, isolation element 254 is deactivated to disconnect logic element 252 from dynamic memory element 256. Accordingly, during period 312, which falls within the first period of time 310, logic element 252 can determine a second calculation result. When the second calculation is complete, during period 314, local media controller 135 can assert control signal 266 to reactivate isolation element 254. When isolation element 254 is activated, the second calculation result is permitted to pass through isolation element 254 and is stored in dynamic memory element 256 at period 316. While the second calculation result is stored in dynamic memory element 256, bit line driver circuits 237 can perform a second pre-charge operation during period 318. The period of time for which the second calculation result is stored at dynamic memory element 256 can be referred to as a second period of time 320.

During the second period of time 320, isolation element 254 is deactivated to disconnect logic element 252 from dynamic memory element 256. Accordingly, during period 322, which falls within the second period of time 320, logic element 252 can determine a third calculation result. This process can proceed accordingly for any number of time periods (e.g., until a requisite number of calculations and pre-charge operations are performed).

Figure 4:
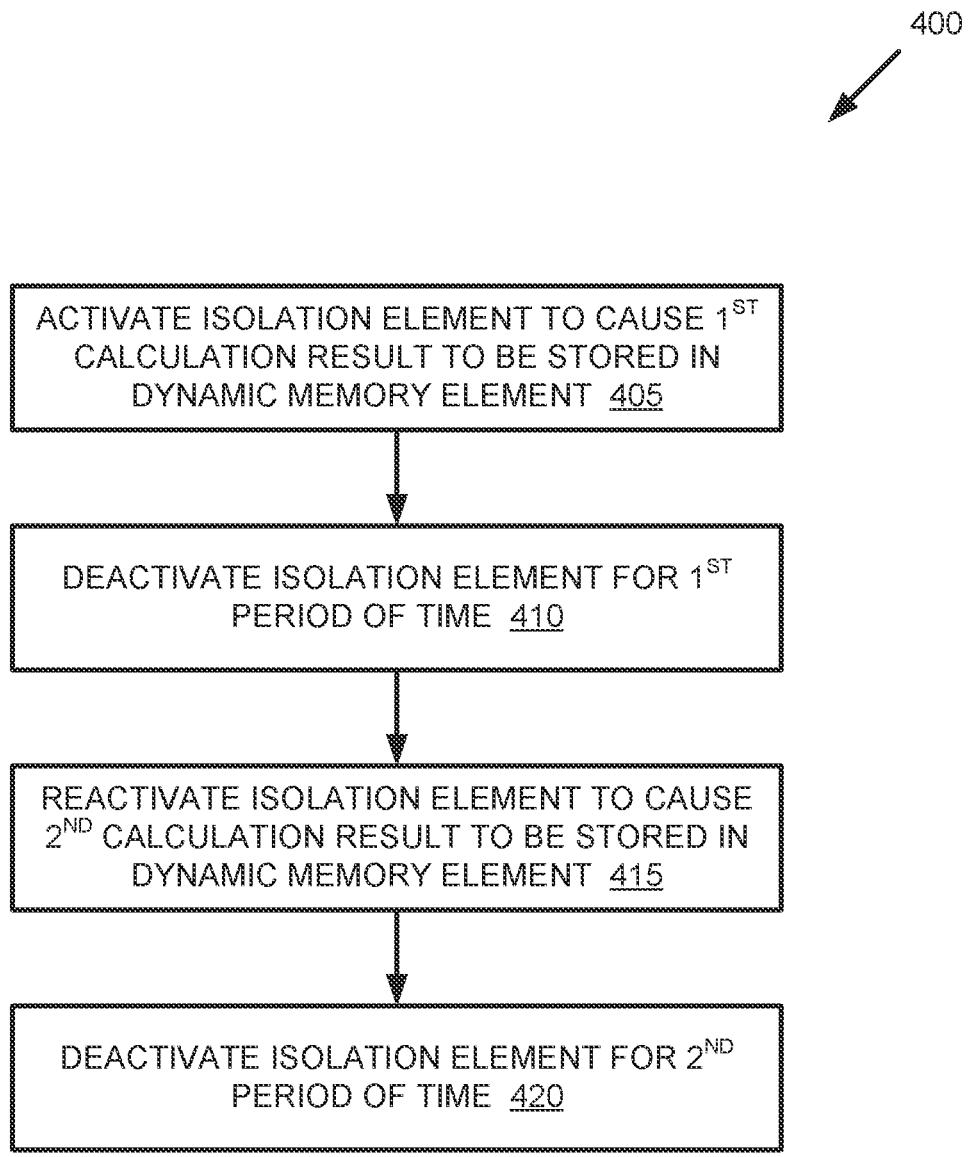
FIG. 4 is a flow diagram of an example method of implementing bitline driver isolation from page buffer circuitry in accordance with some embodiments of the present disclosure.

FIG. 4 is a flow diagram of an example method of implementing bitline driver isolation from page buffer circuitry in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, an isolation element is activated. For example, the processing logic (e.g., local media controller 135) of a memory device, such as memory device 130, causes the isolation element 254, such as semiconductor device 264, to be activated. In one embodiment, the processing logic causes a control signal 266 to be asserted at a gate terminal of semiconductor device 264 which turns semiconductor device 264 into an ON/active state. In the ON/active state, semiconductor device 264 allows a signal, such as a signal representing a first calculation result generated by a logic element 252, such as SA latch 262, to flow through semiconductor device 264 and be stored in a dynamic memory element 256.

At operation 410, the isolation element is deactivated. For example, the processing logic of memory device 130 causes the isolation element 254 to be deactivated for a certain period of time, such as the first period of time 310. In one embodiment, the processing logic causes the control signal 266 to be de-asserted at the gate terminal of semiconductor device 264 which turns semiconductor device 264 into an OFF/inactive state. In the OFF/inactive state, semiconductor device 264 prevents any signal flow between SA latch 262 and semiconductor devices 268 and 270, thereby disconnecting logic element 252 from dynamic memory element 256. While logic element 252 is disconnected from dynamic memory element 256, dynamic memory element 256 maintains the first calculation result and bitline driver circuits 237 can perform a first pre-charging operation on memory array 239 based at least in part on the first calculation result. Also during the first period of time 310, logic element 252 can generate a second calculation result concurrently (i.e., at least partially overlapping in time) with the first-pre-charging operation.

At operation 415, the isolation element is reactivated. For example, the processing logic of memory device 130 causes the isolation element 254, such as semiconductor device 264, to be reactivated. In one embodiment, the processing logic causes control signal 266 to be reasserted at the gate terminal of semiconductor device 264 which turns semiconductor device 264 back into the ON/active state. In the ON/active state, semiconductor device 264 allows a signal, such as a signal representing a second calculation result generated by SA latch 262 during the first period of time 310 to flow through semiconductor device 264 and be stored in dynamic memory element 256.

At operation 420, the isolation element is deactivated. For example, the processing logic of memory device 130 causes the isolation element 254 to be deactivated for a certain period of time, such as the second period of time 320. In one embodiment, the processing logic causes the control signal 266 to be de-asserted at the gate terminal of semiconductor device 264 which turns semiconductor device 264 back into the OFF/inactive state. In the OFF/inactive state, semiconductor device 264 prevents any signal flow between SA latch 262 and semiconductor devices 268 and 270, thereby disconnecting logic element 252 from dynamic memory element 256. While logic element 252 is disconnected from dynamic memory element 256, dynamic memory element 256 maintains the second calculation result and bitline driver circuits 237 can perform a second pre-charging operation on memory array 239 based at least in part on the second calculation result. Also during the second period of time 320, logic element 252 can generate a third calculation result concurrently (i.e., at least partially overlapping in time) with the second-pre-charging operation.

In one embodiment, method 400 includes any number of additional operations and can proceed accordingly for any number of time periods (e.g., until a requisite number of calculations and pre-charge operations are performed).

Figure 5:
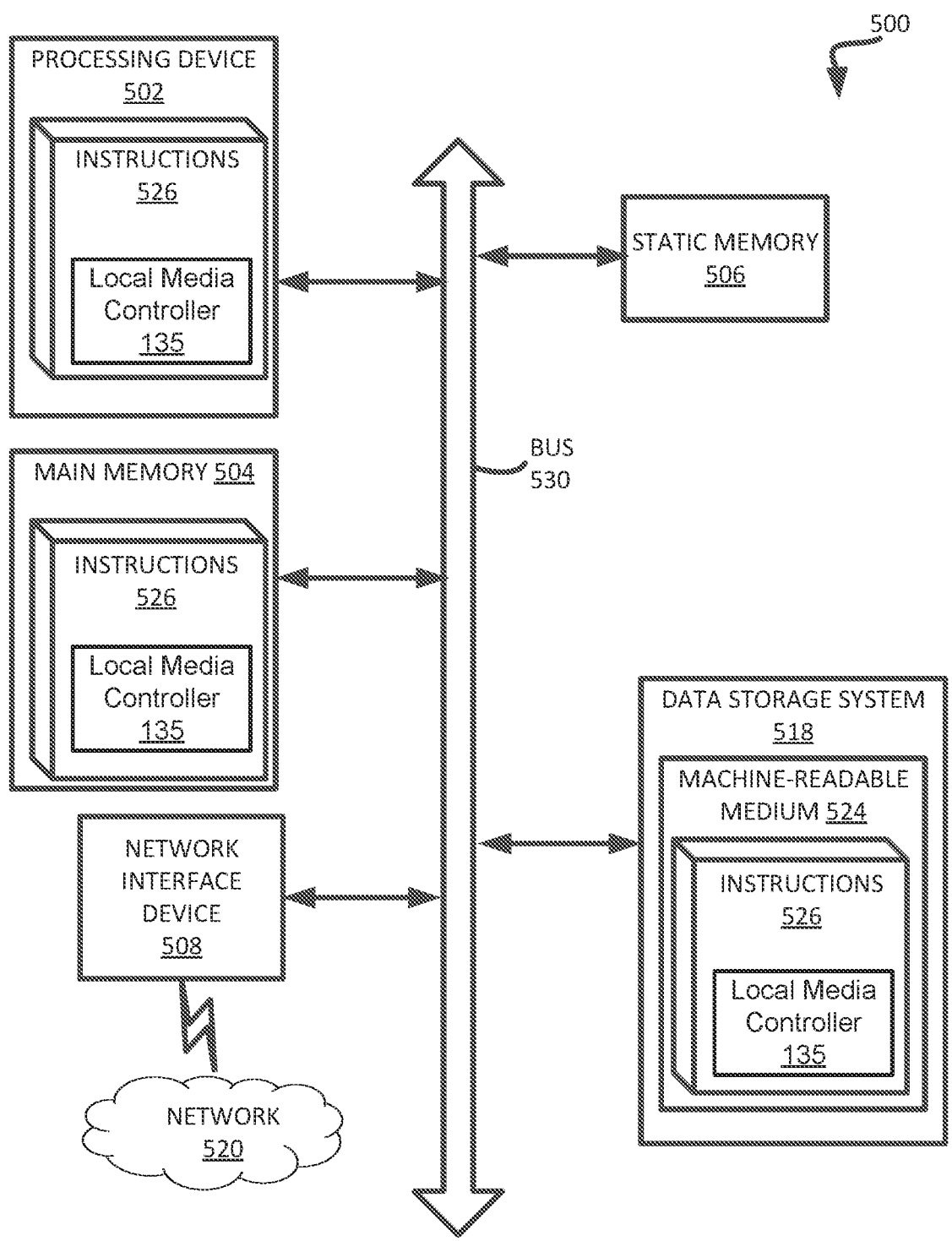
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium, such a non-transitory computer-readable medium) on which is stored one or more sets of instructions 526 or software embodying any one or more of the methodologies or functions described herein. In one embodiment, this medium 524 is also writable by local media controller 135, memory sub-system controller 115, or other components. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to local media controller 135 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A page buffer circuit in a memory device comprising a memory array formed from a plurality of bitlines, the page buffer circuit comprising:
    a logic element configured to perform a series of calculations pertaining to one or more memory access operations and generate a plurality of calculation results associated with the series of calculations;
    a dynamic memory element coupled with the logic element and configured to store the plurality of calculation results;
    an isolation element coupled between the logic element and the dynamic memory element, the isolation element to permit a calculation result from the logic element to pass to the dynamic memory element when activated; and
    a circuit coupled to the dynamic memory element and configured to perform operations associated with the one or more memory access operations and based at least in part on the plurality of calculation results stored in the dynamic memory element,
    wherein the circuit coupled to the dynamic memory element is to perform a first operation on the memory array based at least in part on a first calculation result stored in the dynamic memory element during a first period of time when the isolation element is deactivated to disconnect the logic element from the dynamic memory element, and wherein the logic element is configured to concurrently generate a second calculation result during the first period of time.

2. The page buffer circuit of claim 1, wherein the circuit coupled to the dynamic memory element is to perform a second operation based at least in part on the second calculation result stored in the dynamic memory element during a second period of time when the isolation element is deactivated to disconnect the logic element from the dynamic memory element, and wherein the logic element is configured to concurrently generate a third calculation result during the second period of time.

3. The page buffer circuit of claim 1, wherein the isolation element comprises a first semiconductor device, wherein the isolation element to permit the calculation result to pass to the dynamic memory element in response to a control signal being asserted at a gate terminal of the semiconductor device.

4. The page buffer circuit of claim 1, wherein the dynamic memory element comprises one or more semiconductor devices and associated signal routing lines, and wherein the first period of time is based on a capacitance presented by the one or more semiconductor devices and the associated signal routing lines.

5. The page buffer circuit of claim 1, wherein the first calculation result comprises an indication of a subset of the plurality of bitlines associated with a first memory access operation.

6. The page buffer circuit of claim 5, wherein to perform the first operation on the memory array based at least in part on the first calculation result stored in the dynamic memory element, the circuit coupled to the dynamic memory element is to apply a signal to the subset of the plurality of bitlines identified by the first calculation result.

7. The page buffer circuit of claim 1, wherein the logic element comprises a sense amplifier (SA) latch.

8. A memory device comprising:
    a memory array; and
    control logic, operatively coupled with the memory array, to perform operations comprising:

activating an isolation element coupled between a logic element and a dynamic memory element to cause a first calculation result generated by the logic element to be stored in the dynamic memory element;

deactivating the isolation element for a first period of time, wherein a circuit coupled to the dynamic memory element is to perform a first operation based at least in part on the first calculation result stored in the dynamic memory element and the logic element is to generate a second calculation result concurrently with the first operation during the first period of time; and reactivating the isolation element at an end of the first period of time to cause the second calculation result generated by the logic element to be stored in the dynamic memory element.

9. The memory device of claim 8, wherein the control logic to perform further operations comprising:

deactivating the isolation element for a second period of time, wherein the circuit coupled to the dynamic memory element is to perform a second operation based at least in part on the second calculation result stored in the dynamic memory element and the logic element is to generate a third calculation result concurrently with the first operation during the second period of time.

10. The memory device of claim 8, wherein the isolation element comprises a first semiconductor device, wherein activating the isolation element comprises causing a control signal to be asserted at a gate terminal of the semiconductor device, and wherein deactivating the isolation element comprises causing the control signal to be de-asserted at the gate terminal of the semiconductor device.

11. The memory device of claim 8, wherein the dynamic memory element comprises one or more semiconductor devices and associated signal routing lines, and wherein the first period of time is based on a capacitance presented by the one or more semiconductor devices and the associated signal routing lines.

12. The memory device of claim 8, wherein the memory array comprises a plurality of bitlines, and wherein the first calculation result comprises an indication of a subset of the plurality of bitlines associated with a first memory access operation.

13. The memory device of claim 12, wherein to perform the first operation based at least in part on the first calculation result stored in the dynamic memory element, the circuit coupled to the dynamic memory element is to apply a signal to the subset of the plurality of bitlines identified by the first calculation result.

14. The memory device of claim 8, further comprising:
a page buffer circuit coupled to the memory array, wherein the page buffer circuit comprises the logic element, the dynamic memory element, and the isolation element.

15. A method comprising:

activating an isolation element coupled between a logic element and a dynamic memory element to cause a first calculation result generated by the logic element to be stored in the dynamic memory element;

deactivating the isolation element for a first period of time, wherein a circuit coupled to the dynamic memory element is to perform a first operation based at least in part on the first calculation result stored in the dynamic memory element and the logic element is to generate a second calculation result concurrently with the first operation during the first period of time; and reactivating the isolation element at an end of the first period of time to cause the second calculation result generated by the logic element to be stored in the dynamic memory element.

16. The method of claim 15, further comprising:

deactivating the isolation element for a second period of time, wherein the circuit coupled to the dynamic memory element is to perform a second operation based at least in part on the second calculation result stored in the dynamic memory element and the logic element is to generate a third calculation result concurrently with the first operation during the second period of time.

17. The method of claim 15, wherein the isolation element comprises a first semiconductor device, wherein activating the isolation element comprises causing a control signal to be asserted at a gate terminal of the semiconductor device, and wherein deactivating the isolation element comprises causing the control signal to be de-asserted at the gate terminal of the semiconductor device.

18. The method of claim 15, wherein the dynamic memory element comprises one or more semiconductor devices and associated signal routing lines, and wherein the first period of time is based on a capacitance presented by the one or more semiconductor devices and the associated signal routing lines.

19. The method of claim 15, wherein the circuit coupled to the dynamic memory element is to perform the first operation on a memory array comprising a plurality of bitlines, and wherein the first calculation result comprises an indication of a subset of the plurality of bitlines associated with a first memory access operation.

20. The method of claim 19, wherein to perform the first operation based at least in part on the first calculation result stored in the dynamic memory element, the circuit coupled to the dynamic memory element is to apply a signal to the subset of the plurality of bitlines identified by the first calculation result.

* * * * *